(12) United States Patent
Shah et al.

(10) Patent No.: US 7,295,065 B2
(45) Date of Patent: Nov. 13, 2007

(54) HIGH EFFICIENCY DOHERTY AMPLIFIER WITH A SEGMENTED MAIN AMPLIFIER

(75) Inventors: Tushar Ramanlal Shah, Milpitas, CA (US); Gerald K. Wong, Cupertino, CA (US); Korhan Titizer, Saratoga, CA (US)

(73) Assignee: Beecem Communications Inc., Santa Clara, CA (US)

( * ) Notice: Subject to any disclaimer, the term of this patent is extended or adjusted under 35 U.S.C. 154(b) by 19 days.

(21) Appl. No.: 10/993,408

(22) Filed: Nov. 18, 2004

(65) Prior Publication Data

US 2006/0103466 A1    May 18, 2006

(51) Int. Cl.
    *H03F 3/68* (2006.01)
(52) U.S. Cl. .................... 330/124 R; 330/295
(58) Field of Classification Search ............ 330/124 R, 330/295, 53, 286, 302
    See application file for complete search history.

(56) References Cited

U.S. PATENT DOCUMENTS

| | | | | |
|---|---|---|---|---|
| 5,568,086 A * | 10/1996 | Schuss et al. | ............ | 330/124 R |
| 5,757,229 A * | 5/1998 | Mitzlaff | ................ | 330/124 R |
| 5,786,727 A * | 7/1998 | Sigmon | ................... | 330/124 R |
| 5,966,059 A * | 10/1999 | Sigmon | ...................... | 333/128 |
| 6,262,629 B1 * | 7/2001 | Stengel et al. | .......... | 330/124 R |
| 6,472,934 B1 * | 10/2002 | Pehlke | ........................ | 330/10 |
| 6,744,314 B2 * | 6/2004 | Zhang et al. | ................ | 330/149 |
| 6,798,295 B2 * | 9/2004 | Pengelly et al. | ............ | 330/295 |
| 6,853,245 B2 * | 2/2005 | Kim et al. | ............... | 330/124 R |
| 6,894,562 B2 * | 5/2005 | Nakayama et al. | ........... | 330/53 |
| 7,071,775 B2 * | 7/2006 | Gailus et al. | ........... | 330/124 R |
| 2004/0113698 A1 * | 6/2004 | Kim et al. | ................... | 330/295 |
| 2005/0280466 A1 * | 12/2005 | Gailus et al. | ........... | 330/124 R |
| 2006/0114060 A1 * | 6/2006 | Hellberg et al. | ........ | 330/124 R |

OTHER PUBLICATIONS

PCT/US05/42094, International Search Report mailed Aug. 17, 2006.

\* cited by examiner

*Primary Examiner*—Robert Pascal
*Assistant Examiner*—Hieu Nguyen

(57) ABSTRACT

A Doherty amplifier that includes a main amplifier device and an auxiliary amplifier device. The main amplifier device includes a plurality of independently controllable amplifier segments. The system further includes a coupler for coupling an input signal to each of the main amplifier device and the auxiliary amplifier device. The system further includes an impedance inverter for power combining an output signal of the main amplifier device with an output signal of the auxiliary amplifier device.

41 Claims, 4 Drawing Sheets

… … …

HIGH EFFICIENCY DOHERTY AMPLIFIER WITH A SEGMENTED MAIN AMPLIFIER

TECHNICAL FIELD

The present invention relates to power amplifiers.

BACKGROUND

Wireless communications systems often employ power amplifiers. An optimum power amplifier has a low level of DC power consumption and a high level of power added efficiency (i.e. ratio of the difference between the output power and the input power to DC power). In general, a power amplifier operates at maximum power efficiency when the power amplifier transmits peak output power. However, power efficiency worsens as output power decreases.

One type of a power amplifier that addresses the problem of low power efficiency at lower output powers is a Doherty amplifier. For an overview of the Doherty amplifier, see Doherty, W. H., A New High Efficiency Power Amplifier For Modulated Waves, Proceedings of the Institute of Radio Engineers, Vol. 24, No. 9, pp. 1163-82, September 1936, which is hereby incorporated by reference.

Referring to FIG. 1A, a typical Doherty amplifier 100 can include a main amplifier device 102 and an auxiliary amplifier device 104 connected in parallel. An input signal 110 can be split into a number of signals (e.g., 2) by an input splitter 112. One of the resulting signals can be coupled to an input of the main amplifier device 102 and another signal can be coupled to an input of the auxiliary amplifier device 104. Output of the main amplifier device 102 can be power combined with output of the auxiliary amplifier device 104 through a transmission line 106.

The main amplifier device 102 can be configured to be on for the entire range of output powers of the power amplifier. The auxiliary amplifier device 104 can be configured to turn on only when the main amplifier device 102 saturates. The output power at which the auxiliary amplifier device 104 turns on (and the main amplifier device 102 saturates) is referred to as a power transition point $P_T$.

Referring to FIG. 1B, the efficiency of a typical Doherty amplifier 100 as a function of output power can be represented by a power efficiency curve 126. The power efficiency curve 126 of a typical Doherty amplifier 100 can be divided into two output power regions. In a low output power region 120, where output power is below the power transition point $P_T$, the main amplifier device 102 is turned on and the auxiliary amplifier device 104 is turned off. In a high output power region 122, where the output power is above the power transition point $P_T$, both the main amplifier device 102 and the auxiliary amplifier device 104 are turned on, but the main amplifier device 102 is saturated.

The power transition point $P_T$ is determined by a design parameter $\gamma$. The design parameter $\gamma$ is a ratio of the maximum current through the load 108 to the maximum current delivered by the main amplifier device 102.

In the low output power region 120, as the output power increases, the power efficiency curve 126 of a typical Doherty amplifier 100 follows an upward trajectory. The power efficiency curve 126 of a typical Doherty amplifier 100 reaches a first efficiency peak 132 around a transition point $P_T$, when the main amplifier device 102 is saturated. The power efficiency curve 126 of a typical Doherty amplifier 100 reaches a second efficiency peak 134 around a maximum output power $P_{MAX}$ of the typical Doherty amplifier 100, when both the main amplifier device 102 and the auxiliary amplifier device 104 are saturated.

Although a Doherty amplifier has two efficiency peaks 132, 134, the first efficiency peak 132 of a typical Doherty amplifier 100 is typically below the second efficiency peak 134. For a typical Doherty amplifier 100 with a back-off design parameter of $\gamma$, the output power delivered by the main amplifier device 102 at the second efficiency peak 134 can be 10*log 10($\gamma$) dB higher then the power delivered by the main amplifier device 102 at the first efficiency peak 132. Several factors that can contribute to the difference between the two peaks 132, 134 follow.

The main amplifier device 102 of a typical Doherty amplifier 100 can become self biased at high power (e.g., as a result of large RF input signals 110). Self biasing can result in a large self bias induced quiescent current, and self bias induced quiescent current can bring down the overall efficiency. The amount of self bias induced quiescent current can depend on the size of the main amplifier device 102 and on the input signal 110. Accordingly, if the main amplifier device 102 has a larger size than needed to deliver the required power at the first efficiency peak 132, a large self bias induced quiescent current for the main amplifier device 102 can bring down the overall efficiency at the first efficiency peak 132.

Additionally, efficiency of a power amplifier can depend on a large signal load impedance and a large signal source impedance of the power amplifier. Large signal load and source impedances of a power amplifier can depend on the size of the power amplifier. For a smaller power amplifier, the optimal load impedance to maximize linear output power is typically larger than the optimal load impedance for a larger power amplifier. Smaller power amplifiers typically deliver lower maximum linear power into higher load impedances with high efficiency. Larger power amplifiers, on the other hand, typically deliver a higher maximum linear output power into lower load impedances with high efficiency. However, larger power amplifiers typically deliver a lower maximum linear output power into higher load impedances with poor efficiency.

Larger power amplifiers typically have larger parasitics and lower input resistance, which can reduce high frequency gain, require a different and higher Q input matching and require more reactive load impedances than smaller amplifiers. Additionally, large power amplifiers at low power levels typically operate at much lower current density, which can reduce gain and lead to linearity degradations that can directly impact efficiency.

SUMMARY

In general, in one aspect, a Doherty amplifier is provided that includes a main amplifier device and an auxiliary amplifier device. The main amplifier device includes a plurality of independently controllable amplifier segments. The Doherty amplifier further includes a coupler for coupling an input signal to each of the main amplifier device and the auxiliary amplifier device. The system further includes an impedance inverter for power combining an output signal of the main amplifier device with an output signal of the auxiliary amplifier device.

Implementations of the invention can include one or more of the following features. The plurality of independently controllable amplifier segments can include two independently controllable amplifier segments. The input signal can include a single carrier signal that varies in amplitude. The input signal can include a multi-carrier signal.

At least one of the main amplifier device and the auxiliary amplifier device can include a field effect transistor. The main amplifier device can further include a first field effect transistor having a size substantially equal to W/γ. W is a gate periphery of the total main amplifier device and γ is a backoff design parameter. The main amplifier device can further include a second field effect transistor having a size substantially equal to W(γ−1)/γ. W is a gate periphery of the total main amplifier device and γ is a backoff design parameter.

At least one of the main amplifier device and the auxiliary amplifier device can includes a bipolar junction transistor. The main amplifier device can include a first bipolar junction transistor having a size substantially equal to A/γ. A is an emitter area of the total main amplifier device and γ is a backoff design parameter. The main amplifier device can further include a second bipolar junction transistor having a size substantially equal to A(γ−1)/γ. A is an emitter area of the total main amplifier device and γ is a backoff design parameter.

The Doherty amplifier can further include a bias controller coupled to at least one of the plurality of the independently controllable amplifier segments. The bias controller can control a state of the respective one of the plurality of the independently controllable amplifier segments. The bias controller can be configured to turn the respective one of the independently controllable amplifier segments on only for a range of output powers above a predefined power transition point. The Doherty amplifier can further include a switching control means coupled to at least one of the plurality of the independently controllable amplifier segments. The switching control means can control a state of a respective one of the plurality of the independently controllable amplifier segments. The switching control means can be configured to turn a respective one of the independently controllable amplifier segments on only for a range of output powers above a predefined power transition point.

Implementations of the invention can realize one or more of the following advantages. Self bias induced quiescent current of a main amplifier device in a Doherty amplifier is significantly reduced. For example, self bias induced quiescent current of the main amplifier is reduce four times for a power amplifier system with γ=4. Additionally, parasitics of the main amplifier device are substantially reduced, which results in more optimal input output matching. As a result, the first efficiency peak of the Doherty amplifier can be raised, thereby improving the efficiency of the Doherty amplifier for lower output powers.

The details of one or more implementations of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

The first efficiency peak of a typical Doherty amplifier can be improved by segmenting the main amplifier device of a Doherty amplifier into a number of segments (e.g., 2) such that the main amplifier device is of the optimal size at the first efficiency peak. Segmenting the main amplifier device can significantly reduce the self bias induced quiescent current of the main amplifier device. Moreover, segmenting the main amplifier device can reduce the device parasitics, which results in a more optimal overall input and output matching.

Figure 1A:
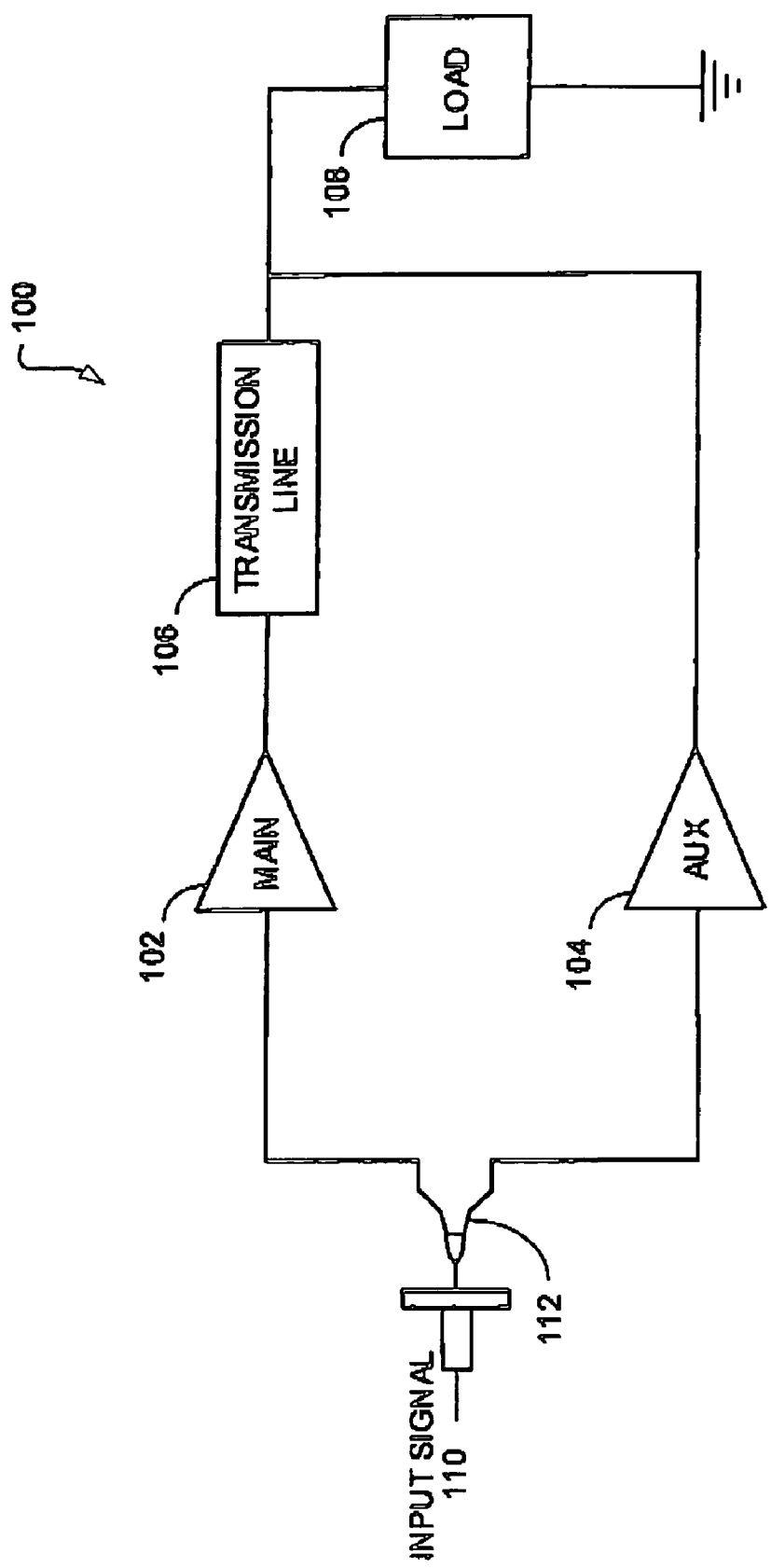
FIG. 1A shows a schematic of a typical Doherty amplifier.
Figure 1B:
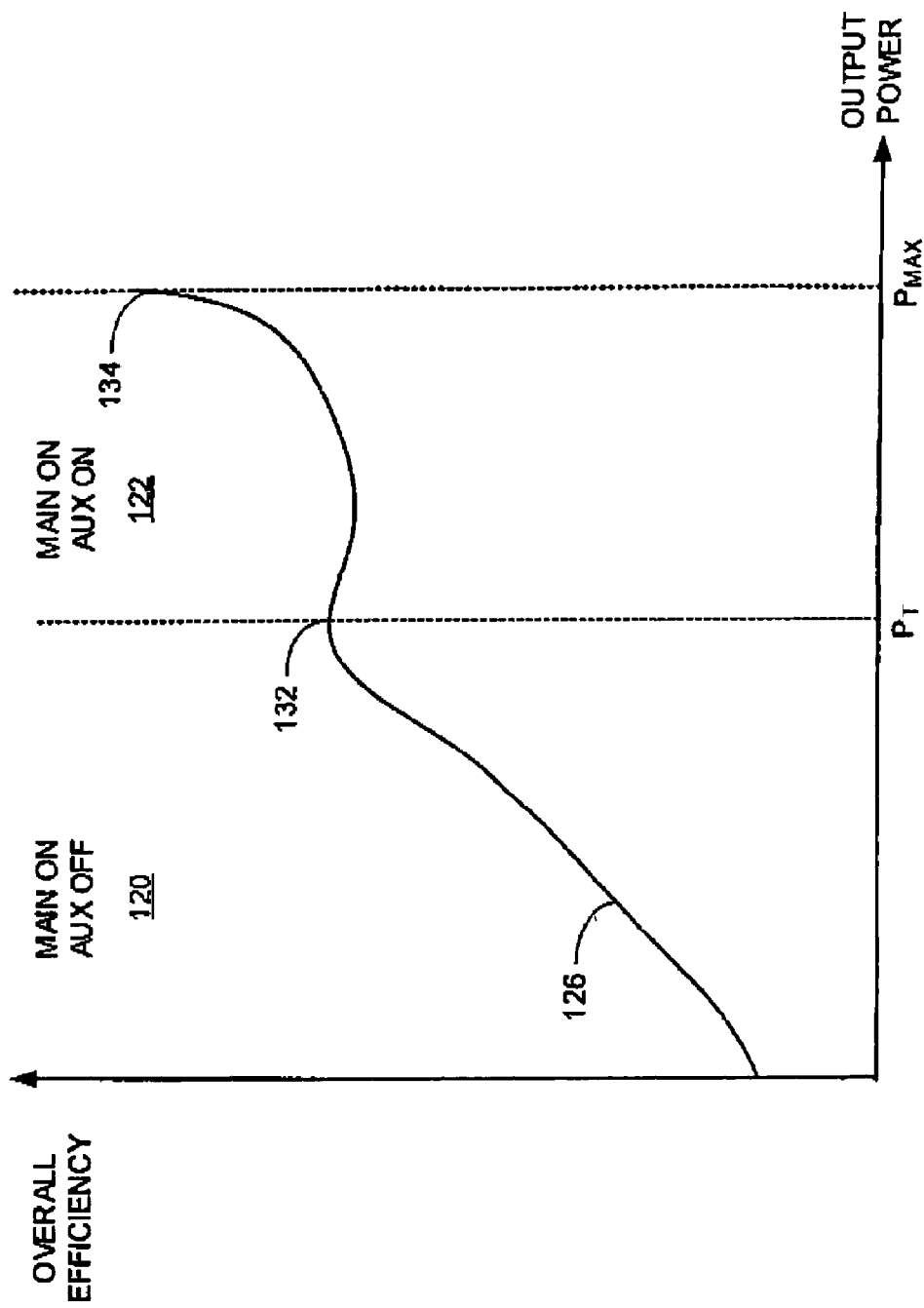
FIG. 1B shows a typical efficiency curve of a typical Doherty amplifier.
Figure 2:
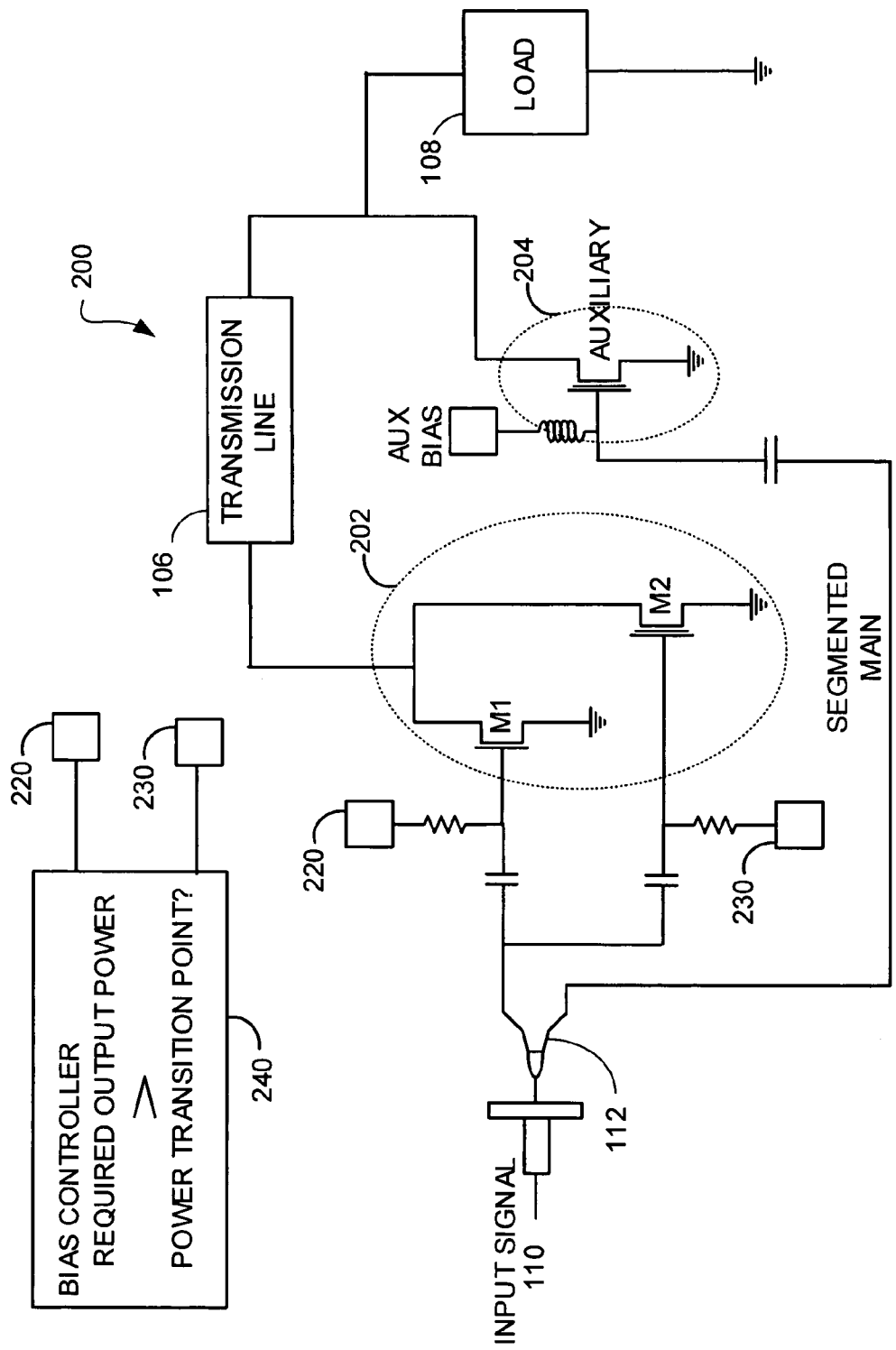
FIG. 2 shows a schematic of a Doherty amplifier with a segmented main amplifier device.

Referring to FIG. 2, a power amplifier system 200 in one implementation can include a main amplifier device 202 and an auxiliary amplifier device 204 connected in parallel. An input signal 110 can be split into a number of signals (e.g., 2) by an input splitter 112. Power splitting can be implemented in a variety of ways (e.g., using a power splitter, a hybrid coupler, a wire split, and so on). One of the resulting signals can be coupled to an input of the main amplifier device 202 and another signal can be coupled to an input of the auxiliary amplifier device 204. Output of the main amplifier device 202 can be power combined with output of the auxiliary amplifier device 204 through a transmission line 106.

The transmission line 106 can be configured such that the output (e.g., current) of the main amplifier device 202 and the output (e.g., current) of the auxiliary amplifier device 204 can add up in phase. In one implementation, the transmission line 106 can power combine the outputs of the main amplifier device 202 and the auxiliary amplifier device 204. The transmission line 106 can be a quarter-wave impedance inverter. The quarter-wave impedance inverter can add a 90° phase lag to the output (e.g., current) of the main amplifier device 202.

The main amplifier device 202 can be segmented into a number (e.g., 2) of segments. The first segment can remain turned on for the entire range of output powers of the power amplifier system 200. The second segment can be turned on only for the range of output powers of the power amplifier system 200 above the power transition point $P_T$.

In one implementation, the two segments of the main amplifier device 202 can include one or more field effect transistors (FETs) M1, M2. The size of the first segment can be optimized to be W/γ, where W is the gate periphery of the total main amplifier device M1+M2. The size of the second segment can be optimized to be W(γ−1)/γ, where W is the gate periphery of the total main amplifier device M1+M2.

Alternatively, the two segments of the main amplifier device 202 can include bipolar junction transistors (BJTs). The size of the first segment can be optimized to be A/γ, where A is the emitter area of the total main amplifier device. The size of the second segment can be A(γ−1)/γ, where A is the emitter area of the total main amplifier device.

The state (e.g., on, off) of each of the two segments of the main amplifier device 202 can be independently controlled based on the desired output power level from the power amplifier in a variety of ways. Independent control can be implemented using control means on the gate, drain, source of a FET or base, collector, emitter of a BJT. In one implementation, state of the segments can be controlled by controlling the biases 220, 230 of the respective transistors M1, M2. For example, the bias 220 of the transistor M1 in the first segment can be controlled such that the transistor M1 in the first segment remains on for the entire range of output powers of the power amplifier system 200. The bias 230 of the transistor M2 in the second segment can be controlled such that the transistor M2 in the second segment remains on only for the range of output powers above the power transition point $P_T$.

In one implementation, the biases 220, 230 can be controlled using a bias controller 240. The bias controller can include digital logic that can compare required output power to a predefined power transition point. If the required output power is above a predefined power transition point, the bias controller 240 can supply an on bias voltage (e.g., appropriate class AB bias voltage) to one or more of the controllable amplifier segments. If the required output power is below a predefined power transition point, the bias controller can supply an off bias voltage (e.g., below pinch-off voltage) to one of the controllable amplifier segments. Alternatively, a switch (not shown) can be used at the input of the two segments to control the states of the two segments.

Figure 3:
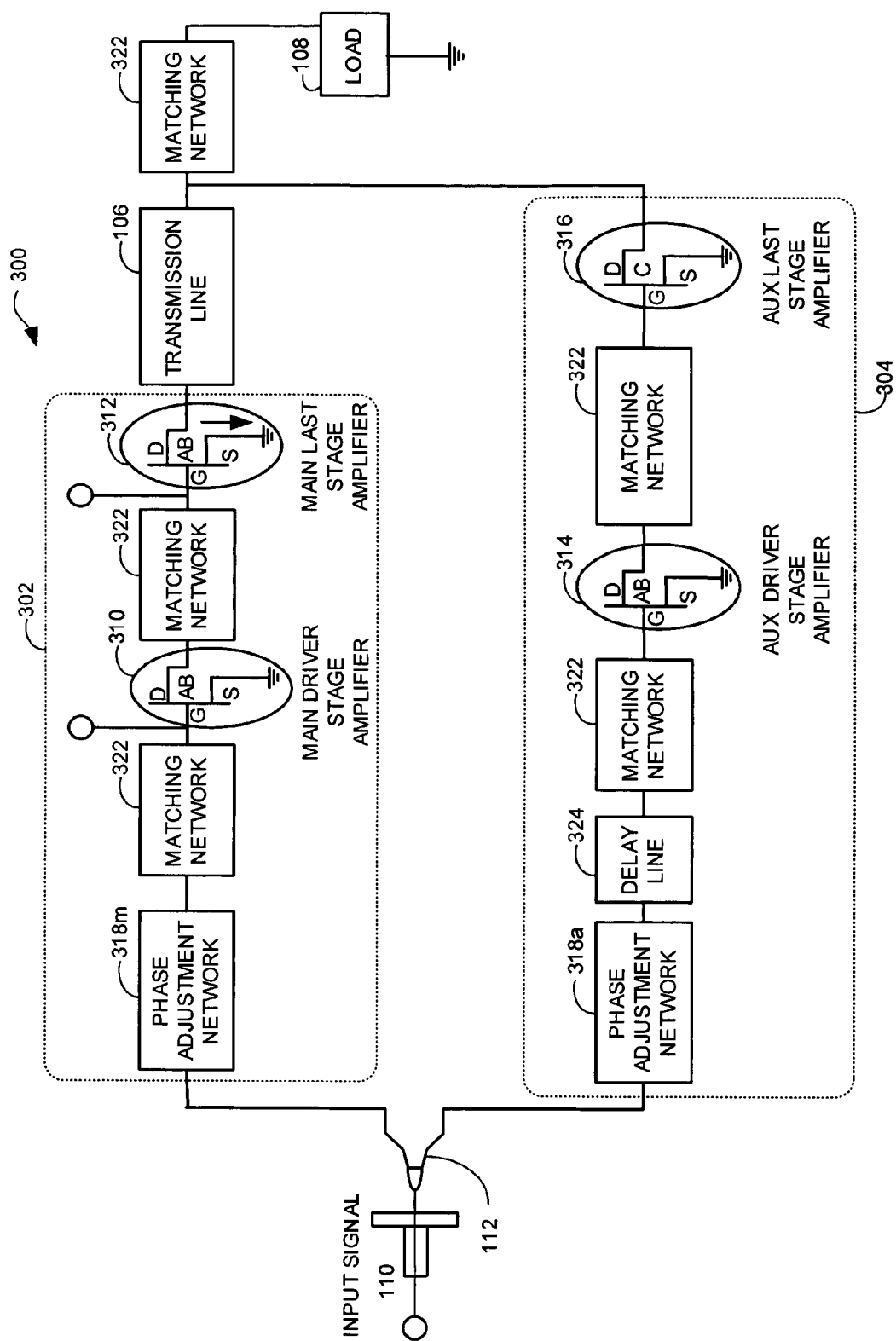
FIG. 3 shows a schematic of an alternative implementation of a Doherty amplifier with a segmented main amplifier device.

Referring to FIG. 3, a power amplifier system 300 in another implementation can include a main amplifier chain 302 and an auxiliary amplifier chain 304 connected in parallel. An input signal 110 can be split into a number of signals (e.g., 2) by an input splitter 112. Power splitting can be implemented in a variety of ways (e.g., using a power splitter, a hybrid coupler, a wire split, and so on). One of the resulting signals can be coupled to an input of the main amplifier chain 302 and another signal can be coupled to an input of the auxiliary amplifier chain 304. Output of the main amplifier chain 302 can be power combined with output of the auxiliary amplifier chain 304 by a transmission line 106.

The transmission line 106 can be configured such that the output (e.g., current) of the main amplifier chain 302 and the output (e.g., current) of the auxiliary amplifier chain 304 can add up in phase. In one implementation, the transmission line 106 power combining the outputs of the main amplifier chain 302 and the auxiliary amplifier chain 304 can be a quarter-wave impedance inverter. The quarter-wave impedance inverter can add a 90° phase lag to the output (e.g., current) of the main amplifier chain 302.

The main amplifier chain 302 can include a main driver stage amplifier 310 and a main last stage amplifier 312. The auxiliary amplifier chain 304 can include an auxiliary driver stage amplifier 314 and an auxiliary last stage amplifier 316.

The power transition point $P_T$ can be selected by adjusting the size of the auxiliary last stage amplifier 316 and the size of the main last stage amplifier 312. The power transition point $P_T$ can also be selected by adjusting the bias (not shown) for auxiliary last stage amplifier 316. In one implementation, the power transition point $P_T$ can be given by $20*\log 10(\gamma)$ where $\gamma$ is a ratio of the maximum current through a load 108 to the maximum current delivered by the main amplifier device 302.

The main driver stage amplifier 310 and the auxiliary driver stage amplifier 314 can be biased in class AB bias. The main last stage amplifier 312 can be biased in class AB bias and the auxiliary last stage amplifier 316 can biased in class C bias.

The main last stage amplifier 312 can be segmented into two segments of unequal size. A smaller of the two segments of the main last stage amplifier 312 can be ON for the entire range of output powers of the power amplifier system 300. A larger of the two segments of the main last stage amplifier 312 can be ON for a predetermined range of output powers of the power amplifier system 300 above the power transition point $P_T$.

The main amplifier chain 302 can include a main fixed phase adjustment network 318m for adjusting the phase of the output current of the main amplifier device 302. Likewise, the auxiliary amplifier chain 304 can include an auxiliary fixed phase adjustment network 318a for adjusting the phase of the output current of the auxiliary amplifier device 304. A fixed phase adjustment network is typically needed only in one of the two chains, that is, the main amplifier chain or the auxiliary amplifier chain.

The power amplifier system 300 can include a number of matching networks 322. A matching network can perform impedance matching between inputs and outputs of various circuit elements in the power amplifier system 300.

The auxiliary amplifier device 304 can include an input 50Ω quarter-wave delay line 324. The input 50Ω quarter-wave delay line 324 and the quarter-wave impedance inverter 106 can ensure that the output currents from the main amplifier device 302 and the auxiliary amplifier device 304 add up in-phase. In one implementation, a lumped element phase shift network is used instead of the input 50Ω quarter-wave delay line 324. Also the length of the delay line 324 can be optimized to a value other than a quarter of a wavelength.

Impedance inverters 106, matching networks 324, and phase adjustment networks 318m, 318a can be implemented using capacitor, transmission line, and inductor based T or PI networks. In one implementation, phase adjustment network 318a can include the delay of transmission line 324.

A number of embodiments of the invention have been described. Nevertheless, it will be understood that various modifications may be made without departing from the spirit and scope of the invention. For example, a power amplifier system can include more than two stages. In one implementation, a multistage power amplifier system can include one main amplifier device and multiple auxiliary amplifier devices. Such a multistage power amplifier system would have multiple efficiency peaks. However, because a multistage amplifier system typically needs additional impedance inverters, phase adjustment networks, and so on, a multistage amplifier system can be more costly than a two-stage power amplifier system.

The main amplifier device of a power amplifier system, regardless of the number of auxiliary amplifier devices in the power amplifier system, can be segmented into more than two segments. A main amplifier device segmented into multiple segments can improve multiple efficiency peaks of a power amplifier system.

Furthermore, the input signal 110 to a power amplifier system can be a single carrier signal or a multi-carrier signal. A single carrier signal is a continuous signal of a single frequency called the carrier, which is modulated by a second data-carrying signal. Common kinds of modulation used for the data-carrying signal are amplitude modulation (AM), frequency modulation (FM), phase modulation (PSK—Phase Shift Keying) and amplitude/phase modulation (QAM—Quadrature Amplitude Modulation). For a multi-carrier signal, the data to be transmitted can be split into several components, and each of these data components can modulate a data carrying signal. The data carrying signal can in turn modulate separate carrier signals. This can also be achieved in digital signal processing by using the FFT/IFFT operation. Individual carriers have narrow bandwidths, but the composite signal can have broad bandwidth depending on the number of carriers supported. Accordingly, other embodiments are within the scope of the following claims.

What is claimed is:

1. A Doherty power amplifier comprising:
   a main amplifier device comprising a plurality of independently controllable amplifier segments;

an auxiliary amplifier device;
a coupler for coupling an input signal to each of the main amplifier device and the auxiliary amplifier device; and
a single impedance inverter for power combining an output signal of the main amplifier device with an output signal of the auxiliary amplifier device,
wherein output signals of the controllable amplifier segments are combined at an input of the impedance inverter, and
wherein the output signal of the main amplifier device and the output signal of the auxiliary amplifier device are power combined at an output of the impedance inverter.

2. The Doherty power amplifier of claim 1, wherein the plurality of independently controllable amplifier segments comprises two independently controllable amplifier segments.

3. The Doherty power amplifier of claim 1, wherein the input signal coupled to each of the main amplifier device and the auxiliary amplifier device comprises a single carrier signal that varies in amplitude.

4. The Doherty power amplifier of claim 1, wherein the input signal coupled to each of the main amplifier device and the auxiliary amplifier device comprises a multi-carrier signal.

5. The Doherty power amplifier of claim 1, wherein at least one of the main amplifier device and the auxiliary amplifier device includes a field effect transistor.

6. The Doherty power amplifier of claim 5, wherein the plurality of independently controllable amplifier segments include:
a first independently controllable segment having a size substantially equal to $W/\gamma$, wherein W is a gate periphery of the main amplifier device and $\gamma$ is a backoff design parameter; and
a second independently controllable segment having a size substantially equal to $W(\gamma-1)/\gamma$, wherein W is the gate periphery of the main amplifier device and $\gamma$ is the backoff design parameter.

7. The Doherty power amplifier of claim 1, wherein at least one of the main amplifier device and the auxiliary amplifier device includes a bipolar junction transistor.

8. The Doherty power amplifier of claim 7, wherein the plurality of independently controllable amplifier segments include:
a first independently controllable segment having a size substantially equal to $A/\gamma$, wherein A is an emitter area of the main amplifier device and $\gamma$ is a backoff design parameter; and
a second independently controllable segment having a size substantially equal to $A(\gamma-1)/\gamma$, wherein A is the emitter area of the main amplifier device and $\gamma$ is the backoff design parameter.

9. The Doherty power amplifier of claim 1, further comprising a bias controller coupled to at least one of the plurality of the independently controllable amplifier segments to control a state of the respective one of the plurality of the independently controllable amplifier segments.

10. The Doherty power amplifier of claim 9, wherein the bias controller is configured to turn the respective one of the independently controllable amplifier segments on only for a range of output powers above a predefined power transition point.

11. The Doherty power amplifier of claim 1, further comprising a switching control means coupled to at least one of the plurality of the independently controllable amplifier segments to control a state of a respective one of the plurality of the independently controllable amplifier segments.

12. The Doherty power amplifier of claim 11, wherein the switching control means is configured to turn a respective one of the independently controllable amplifier segments on only for a range of output powers above a predefined power transition point.

13. The Doherty power amplifier of claim 9, wherein the bias controller is configured to supply an ON bias voltage to turn on the one of the independently controllable amplifier segments.

14. The Doherty power amplifier of claim 9, wherein the bias controller is configured to supply an OFF bias voltage to the one of the independently controllable amplifier segments for a range of output power below a predefined power transition point.

15. The Doherty power amplifier of claim 1, wherein the impedance inverter is a transmission line configured to provide a 90° phase shift to at least one of the output signal of the main amplifier device and the output signal of the auxiliary amplifier device.

16. The Doherty power amplifier of claim 1, wherein a power transition point is determined based on an output power at which the main amplifier device saturates and at which the auxiliary amplifier device turns on.

17. A Doherty power amplifier comprising:
a main amplifier device including a plurality of independently controllable amplifier segments, the independently controllable amplifier segments having a common drain shared output;
an auxiliary amplifier device;
a coupler for coupling an input signal to each of the main amplifier device and the auxiliary amplifier device; and
a single impedance inverter for power combining an output signal of the main amplifier device with an output signal of the auxiliary amplifier device,
wherein the common drain shared output of the plurality of independently controllable amplifier segments is connected to an input of the impedance inverter, and
wherein the output signal of the main amplifier device and the output signal of the auxiliary amplifier device are power combined at an output of the impedance inverter.

18. The Doherty power amplifier of claim 17, wherein the plurality of independently controllable amplifier segments comprises two independently controllable amplifier segments.

19. The Doherty power amplifier of claim 17, wherein the input signal coupled to each of the main amplifier device and the auxiliary amplifier device comprises a single carrier signal that varies in amplitude.

20. The Doherty power amplifier of claim 17, wherein the input signal coupled to each of the main amplifier device and the auxiliary amplifier device comprises a multi-carrier signal.

21. The Doherty power amplifier of claim 18, wherein the plurality of independently controllable amplifier segments include:
a first independently controllable segment having a size substantially equal to $W/\gamma$, wherein W is a gate periphery of the main amplifier device and $\gamma$ is a backoff design parameter; and
a second independently controllable segment having a size substantially equal to $W(\gamma-1)/\gamma$, wherein W is the gate periphery of the main amplifier device and $\gamma$ is the backoff design parameter.

22. The Doherty power amplifier of claim 17, further comprising a bias controller coupled to at least one of the plurality of the independently controllable amplifier segments to control a state of the respective one of the plurality of the independently controllable amplifier segments.

23. The Doherty power amplifier of claim 22, wherein the bias controller is configured to turn the respective one of the independently controllable amplifier segments on only for a range of output powers above a predefined power transition point.

24. The Doherty power amplifier of claim 17, further comprising a switching control means coupled to at least one of the plurality of the independently controllable amplifier segments to control a state of a respective one of the plurality of the independently controllable amplifier segments.

25. The Doherty power amplifier of claim 24, wherein the switching control means is configured to turn a respective one of the independently controllable amplifier segments on only for a range of output powers above a predefined power transition point.

26. The Doherty power amplifier of claim 22, wherein the bias controller is configured to supply an ON bias voltage to turn on the one of the independently controllable amplifier segments.

27. The Doherty power amplifier of claim 22, wherein the bias controller is configured to supply an OFF bias voltage to the one of the independently controllable amplifier segments for a range of output power below a predefined power transition point.

28. The Doherty power amplifier of claim 17, wherein the impedance inverter is a transmission line configured to provide a 90° phase shift to at least one of the output signal of the main amplifier device and the output signal of the auxiliary amplifier device.

29. The Doherty power amplifier of claim 17, wherein a power transition point is determined based on an output power at which the main amplifier device saturates and at which the auxiliary amplifier device turns on.

30. A Doherty power amplifier comprising:
   a main amplifier device comprising a plurality of independently controllable amplifier segments, the independently controllable amplifier segments having a common collector shared output;
   an auxiliary amplifier device;
   a coupler for coupling an input signal to each of the main amplifier device and the auxiliary amplifier device; and
   a single impedance inverter for power combining an output signal of the main amplifier device with an output signal of the auxiliary amplifier device,
   wherein the common collector shared output of the plurality of independently controllable amplifier segments is connected to an input of the impedance inverter; and
   wherein the output signal of the main amplifier device and the output signal of the auxiliary amplifier device is power combined at an output of the impedance inverter.

31. The Doherty power amplifier of claim 30, wherein the plurality of independently controllable amplifier segments comprises two independently controllable amplifier segments.

32. The Doherty power amplifier of claim 30, wherein the input signal to each of the main amplifier device and the auxiliary amplifier device comprises a single carrier signal that varies in amplitude.

33. The Doherty power amplifier of claim 30, wherein the input signal to each of the main amplifier device and the auxiliary amplifier device comprises a multi-carrier signal.

34. The Doherty power amplifier of claim 31, wherein the independently controllable amplifier segments include:
   a first independently controllable amplifier segment having a size substantially equal to $A/\gamma$, wherein A is an emitter area of the main amplifier device and $\gamma$ is a backoff design parameter; and
   a second independently controllable amplifier segment having a size substantially equal to $A(\gamma-1)/\gamma$, wherein A is the emitter area of the main amplifier device and $\gamma$ is the backoff design parameter.

35. The Doherty power amplifier of claim 30, further comprising a bias controller coupled to at least one of the plurality of the independently controllable amplifier segments to control a state of the respective one of the plurality of the independently controllable amplifier segments.

36. The Doherty power amplifier of claim 35, wherein the bias controller is configured to turn the respective one of the independently controllable amplifier segments on only for a range of output powers above a predefined power transition point.

37. The Doherty power amplifier of claim 30, further comprising a switching control means coupled to at least one of the plurality of the independently controllable amplifier segments to control a state of a respective one of the plurality of the independently controllable amplifier segments.

38. The Doherty power amplifier of claim 37, wherein the switching control means is configured to turn a respective one of the independently controllable amplifier segments on only for a range of output powers above a predefined power transition point.

39. The Doherty power amplifier of claim 35, wherein the bias controller is configured to supply an ON bias voltage to turn on the one of the independently controllable amplifier segments.

40. The Doherty power amplifier of claim 35, wherein the bias controller is configured to supply an OFF bias voltage to the one of the independently controllable amplifier segments for a range of output power below a predefined power transition point.

41. The Doherty power amplifier of claim 30, wherein the impedance inverter is a transmission line configured to provide a 90° phase shift to at least one of the output signal of the main amplifier device and the output signal of the auxiliary amplifier device.

* * * * *